US010725485B2

(12) United States Patent
Wetzel et al.

(10) Patent No.: US 10,725,485 B2
(45) Date of Patent: Jul. 28, 2020

(54) SYSTEM AND METHOD FOR CALCULATING SUBSTRATE SUPPORT TEMPERATURE

(71) Applicant: LAM RESEARCH CORPORATION, Fremont, CA (US)

(72) Inventors: David Joseph Wetzel, San Jose, CA (US); Alexander Bleakie, Fremont, CA (US); Jacob Frederick Theisen, Boise, ID (US)

(73) Assignee: LAM RESEARCH CORPORATION, Fremont, CA (US)

( * ) Notice: Subject to any disclaimer, the term of this patent is extended or adjusted under 35 U.S.C. 154(b) by 30 days.

(21) Appl. No.: 15/824,447

(22) Filed: Nov. 28, 2017

(65) Prior Publication Data

US 2018/0173255 A1    Jun. 21, 2018

Related U.S. Application Data

(60) Provisional application No. 62/434,665, filed on Dec. 15, 2016.

(51) Int. Cl.
*G05D 23/24*    (2006.01)
*G05D 23/19*    (2006.01)
(Continued)

(52) U.S. Cl.
CPC ......... *G05D 23/2401* (2013.01); *G01K 7/427* (2013.01); *G01K 13/02* (2013.01);
(Continued)

(58) Field of Classification Search
CPC ........ G01K 7/427; G01K 13/02; G01R 21/14; G01R 21/127; G05D 23/1917; H04L 21/00
(Continued)

(56) References Cited

U.S. PATENT DOCUMENTS

2008/0311688 A1    12/2008    Yamashita et al.
2011/0132541 A1*    6/2011    Tandou ............. H01L 21/67017
                                                                        156/345.27
(Continued)

OTHER PUBLICATIONS

Wikipedia, Control Theory (revision: Dec. 9, 2016), Wikimedia Foundation; 2016, 15 pages; retrieved from "http://en.wikipedia.org/w/index.php?title=Control_thoery&oldid=753818130" on Aug. 14, 2019. (Year: 2016).*

(Continued)

*Primary Examiner* — Mohammad Ali
*Assistant Examiner* — Joshua T Sanders

(57)    ABSTRACT

A temperature controller for a substrate support in a substrate processing system includes a power parameter module configured to calculate a power parameter indicative of power supplied to the substrate support. A coolant temperature parameter module configured to calculate a coolant temperature parameter indicative of a temperature of a coolant supplied to the substrate support. A heat transfer gas parameter module is configured to calculate a heat transfer gas parameter indicative of flow rates of a heat transfer gas supplied to the substrate support. A temperature calculation module is configured to calculate a temperature of the substrate support using the power parameter, the coolant temperature parameter, and the heat transfer gas parameter.

14 Claims, 4 Drawing Sheets

(51) Int. Cl.
    *G01K 13/02*     (2006.01)
    *H04L 21/00*     (2006.01)
    *G01K 7/42*     (2006.01)
    *G01R 21/14*     (2006.01)
    *G01R 21/127*     (2006.01)

(52) U.S. Cl.
    CPC .......... *G01R 21/14* (2013.01); *G05D 23/1917* (2013.01); *H04L 21/00* (2013.01); *G01R 21/127* (2013.01)

(58) Field of Classification Search
    USPC ........................................................ 700/299
    See application file for complete search history.

(56) References Cited

U.S. PATENT DOCUMENTS

| | | |
|---|---|---|
| 2014/0262199 A1 | 9/2014 | Kobayashi et al. |
| 2015/0134128 A1 | 5/2015 | Mahadeswaraswamy et al. |
| 2015/0219479 A1* | 8/2015 | Adderly .................. H01L 21/00 73/861 |
| 2015/0219499 A1 | 8/2015 | Waldmann et al. |
| 2016/0302258 A1 | 10/2016 | Hayashi et al. |

OTHER PUBLICATIONS

Notification of Transmittal of International Search Report and the Written Opinion of the International Searching Authority corresponding to Application No. PCT/US2017/066406 dated Mar. 28, 2018, 15 pages.

* cited by examiner

SYSTEM AND METHOD FOR CALCULATING SUBSTRATE SUPPORT TEMPERATURE

CROSS-REFERENCE TO RELATED APPLICATIONS

This application claims the benefit of U.S. Provisional Application No. 62/434,665, filed on Dec. 15, 2016. The entire disclosure of the applications referenced above is incorporated herein by reference.

FIELD

The present disclosure relates to estimating a temperature of a substrate support in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, dielectric etch, and/or other etch, deposition, or cleaning processes. A substrate may be arranged on a substrate support, such as a pedestal, an electrostatic chuck (ESC), etc. in a processing chamber of the substrate processing system. During etching, etch gas mixtures including one or more gases may be introduced into the processing chamber and plasma may be used to initiate chemical reactions.

The substrate support may include a ceramic layer arranged to support a substrate. For example, the substrate may be clamped to the ceramic layer during processing. The substrate support may include a plurality of channels to provide a heat transfer gas (e.g., helium) to a backside of the substrate arranged on the ceramic layer. The heat transfer gas facilitates cooling of the substrate and/or the ceramic layer.

SUMMARY

A temperature controller for a substrate support in a substrate processing system includes a power parameter module configured to calculate a power parameter indicative of power supplied to the substrate support. A coolant temperature parameter module configured to calculate a coolant temperature parameter indicative of a temperature of a coolant supplied to the substrate support. A heat transfer gas parameter module is configured to calculate a heat transfer gas parameter indicative of flow rates of a heat transfer gas supplied to the substrate support. A temperature calculation module is configured to calculate a temperature of the substrate support using the power parameter, the coolant temperature parameter, and the heat transfer gas parameter.

In other features, the power parameter corresponds to an average power supplied to the substrate support by a plurality of power sources. The power parameter module is configured to calculate the power parameter based on a first power supplied by a first power source, a second power supplied by a second power source, and a duty cycle. The coolant temperature parameter corresponds to a difference between a first temperature of the coolant supplied to the substrate support and a second temperature of the coolant returning from the substrate support. The heat transfer gas parameter corresponds to a difference between a first flow rate of the heat transfer gas supplied to a first zone of the substrate support and a second flow rate of the heat transfer gas supplied to a second zone of the substrate support. The temperature calculation module is configured to calculate the temperature of the substrate support further based on a clamping voltage applied to the substrate support.

In other features, the temperature calculation module is configured to calculate the temperature of the substrate support according to a sum of a first product of a first modification factor and the power parameter, a second product of a second modification factor and the coolant temperature parameter, and a third product of a third modification factor and the heat transfer gas parameter. Memory stores data indicative of a relationship between the power parameter, the coolant temperature parameter, and the heat transfer gas parameter, and the temperature of the substrate support.

In other features, the temperature calculation module is configured to retrieve the data from the memory and calculate the temperature of the substrate support using the retrieved data, the power parameter, the coolant temperature parameter, and the heat transfer gas parameter. The calculated temperature of the substrate support corresponds to a temperature of a ceramic layer. The temperature controller is configured to control, based on the calculated temperature of the substrate support, at least one of a flow of the coolant and the flow rates of the heat transfer gas.

A method of controlling a temperature of a substrate support in a substrate processing system includes calculating a power parameter indicative of power supplied to the substrate support, calculating a coolant temperature parameter indicative of a temperature of a coolant supplied to the substrate support, calculating a heat transfer gas parameter indicative of flow rates of a heat transfer gas supplied to the substrate support, calculating the temperature of the substrate support using the power parameter, the coolant temperature parameter, and the heat transfer gas parameter, and controlling, based on the calculated temperature, at least one of a flow of the coolant and the flow rates of the heat transfer gas.

In other features, the power parameter corresponds to an average power supplied to the substrate support by a plurality of power sources. Calculating the power parameter includes calculating the power parameter based on a first power supplied by a first power source, a second power supplied by a second power source, and a duty cycle. The coolant temperature parameter corresponds to a difference between a first temperature of the coolant supplied to the substrate support and a second temperature of the coolant returning from the substrate support. The heat transfer gas parameter corresponds to a difference between a first flow rate of the heat transfer gas supplied to a first zone of the substrate support and a second flow rate of the heat transfer gas supplied to a second zone of the substrate support. Calculating the temperature of the substrate support includes calculating the temperature of the substrate support further based on a clamping voltage applied to the substrate support.

In other features, calculating the temperature of the substrate support includes calculating the temperature of the substrate support according to a sum of a first product of a first modification factor and the power parameter, a second product of a second modification factor and the coolant temperature parameter, and a third product of a third modification factor and the heat transfer gas parameter. The method further includes storing, in memory, data indicative of a relationship between the power parameter, the coolant temperature parameter, and the heat transfer gas parameter, and the temperature of the substrate support. The method further includes retrieving the data from the memory and calculating the temperature of the substrate support using the retrieved data, the power parameter, the coolant temperature parameter, and the heat transfer gas parameter.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

In some configurations, a substrate support in a substrate processing system may not be suitable for implementing temperature control (e.g., of a ceramic layer) and/or temperature sensors. For example, a substrate support may include a lower electrode coupled to a radio frequency (RF) voltage for generating plasma within a processing chamber. The substrate support may also correspond to an electrostatic chuck (ESC) coupled to a voltage for clamping (i.e., a clamping voltage) a substrate to the ceramic layer. Accordingly, a relatively high power (e.g., greater than or equal to 18 kW) associated with some substrate support configurations may interfere with the operation of electrical components associated with temperature control of the substrate support, such as heating elements, temperature sensors, etc. Conversely, heating elements and temperature sensors may interfere with plasma generation. For example, heating elements and temperature sensors arranged in a substrate support in a high power substrate support configuration may increase the likelihood of plasma arcing or plasma generation failure.

Temperature calculation systems and methods according to the principles of the present disclosure implement virtual temperature sensing to calculate a temperature of the substrate support and/or a substrate arranged on the substrate support without integrated temperature sensors. For example, the temperature calculation system calculates the substrate support temperature according to various parameters related to the operation of the substrate support, including, but not limited to: a temperature of a coolant supplied to the substrate support; a temperature of the coolant returning from (i.e., flowing out of) the substrate support; an RF power supplied to the substrate support; and/or a flow of a heat transfer gas (e.g., helium) provided to a substrate support.

Figure 1:
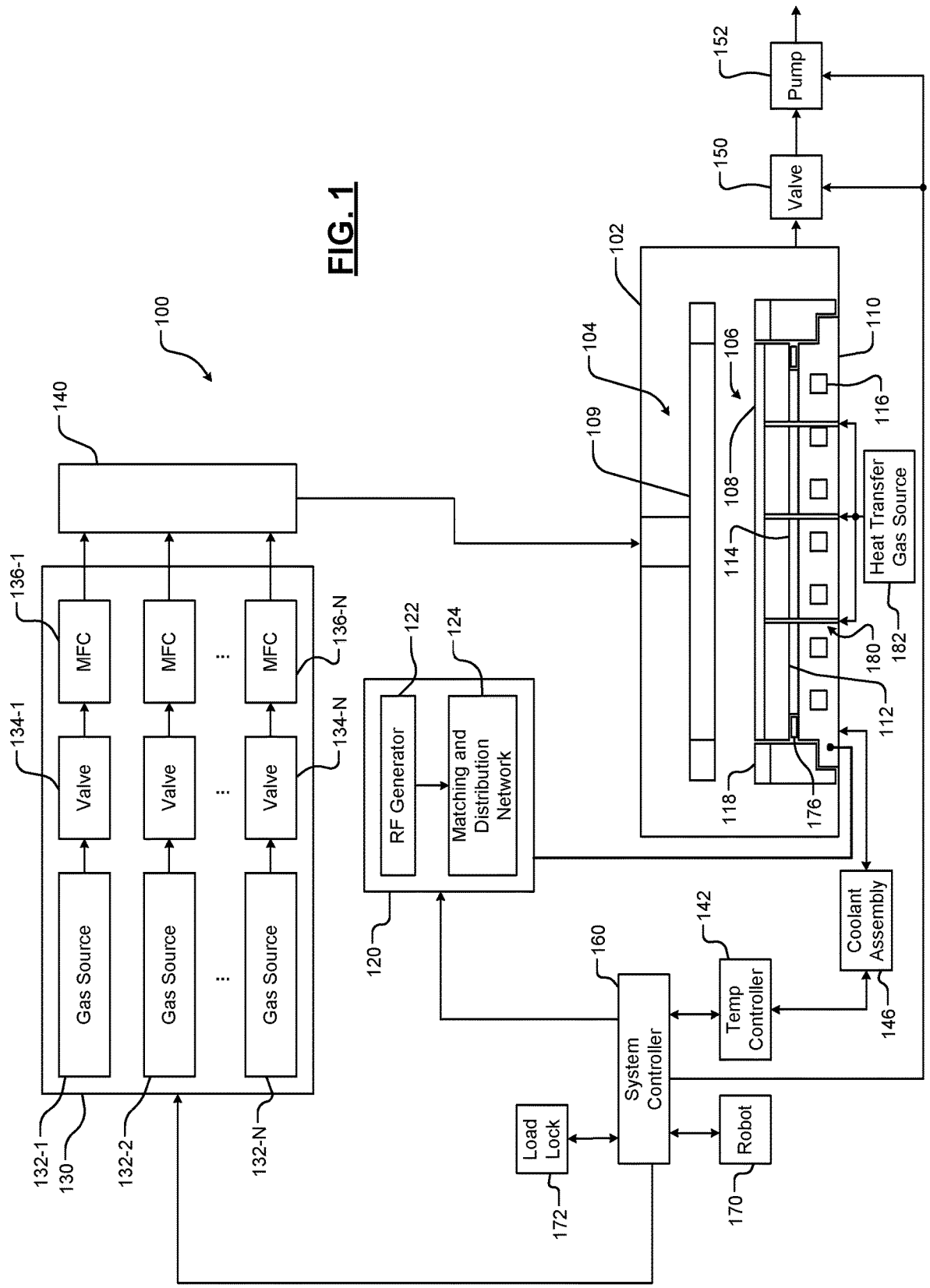
FIG. 1 is an example substrate processing system according to the present disclosure.

Referring now to FIG. 1, an example substrate processing system 100 is shown. For example only, the substrate processing system 100 may be used for performing etching using RF plasma and/or other suitable substrate processing. The substrate processing system 100 includes a processing chamber 102 that encloses other components of the substrate processing system 100 and contains the RF plasma. The substrate processing chamber 102 includes an upper electrode 104 and a substrate support 106, such as an ESC. During operation, a substrate 108 is arranged on the substrate support 106. While a specific substrate processing system 100 and chamber 102 are shown as an example, the principles of the present disclosure may be applied to other types of substrate processing systems and chambers, such as a substrate processing system that generates plasma in-situ, that implements remote plasma generation and delivery (e.g., using a plasma tube, a microwave tube), etc.

For example only, the upper electrode 104 may include a gas distribution device such as a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a ceramic layer 112. A bond layer 114 (e.g., a bond layer) may be arranged between the ceramic layer 112 and the baseplate 110. The baseplate 110 may include one or more coolant channels 116 for flowing coolant through the baseplate 110. The substrate support 106 may include an edge ring 118 arranged to surround an outer perimeter of the substrate 108.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. In the present example, the RF voltage is supplied to the lower electrode. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more etch gases and mixtures thereof. The gas sources may also supply carrier and/or purge gas. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160. In some examples, a protective seal 176 may be provided around a perimeter of the bond layer 114 between the ceramic layer 112 and the baseplate 110.

The substrate support 106 includes a plurality of channels 180 arranged to provide a heat transfer gas such as helium from a heat transfer gas source 182 to a backside of the substrate 108. The heat transfer gas facilitates cooling of the substrate 108 and/or the ceramic layer 112. Although shown separately, the heat transfer gas source 182 may be implemented within the gas delivery system 130.

The temperature controller 142 (and/or the system controller 160) according to the principles of the present disclosure implements a temperature calculation system and method as described below in more detail. For example, the temperature controller 142 is configured to calculate a temperature of the substrate support 106 (e.g., the ceramic layer 112) based on a temperature of the coolant supplied to the substrate support 106 from the coolant assembly 146, a temperature of the coolant returning from (i.e., flowing out of) the substrate support 106 back to the coolant assembly 146, an RF power supplied to the substrate support 106, a flow of the heat transfer gas provided to the substrate support 106 from the heat transfer gas source 182, and/or a clamping voltage supplied to the substrate support 106.

Figure 2:
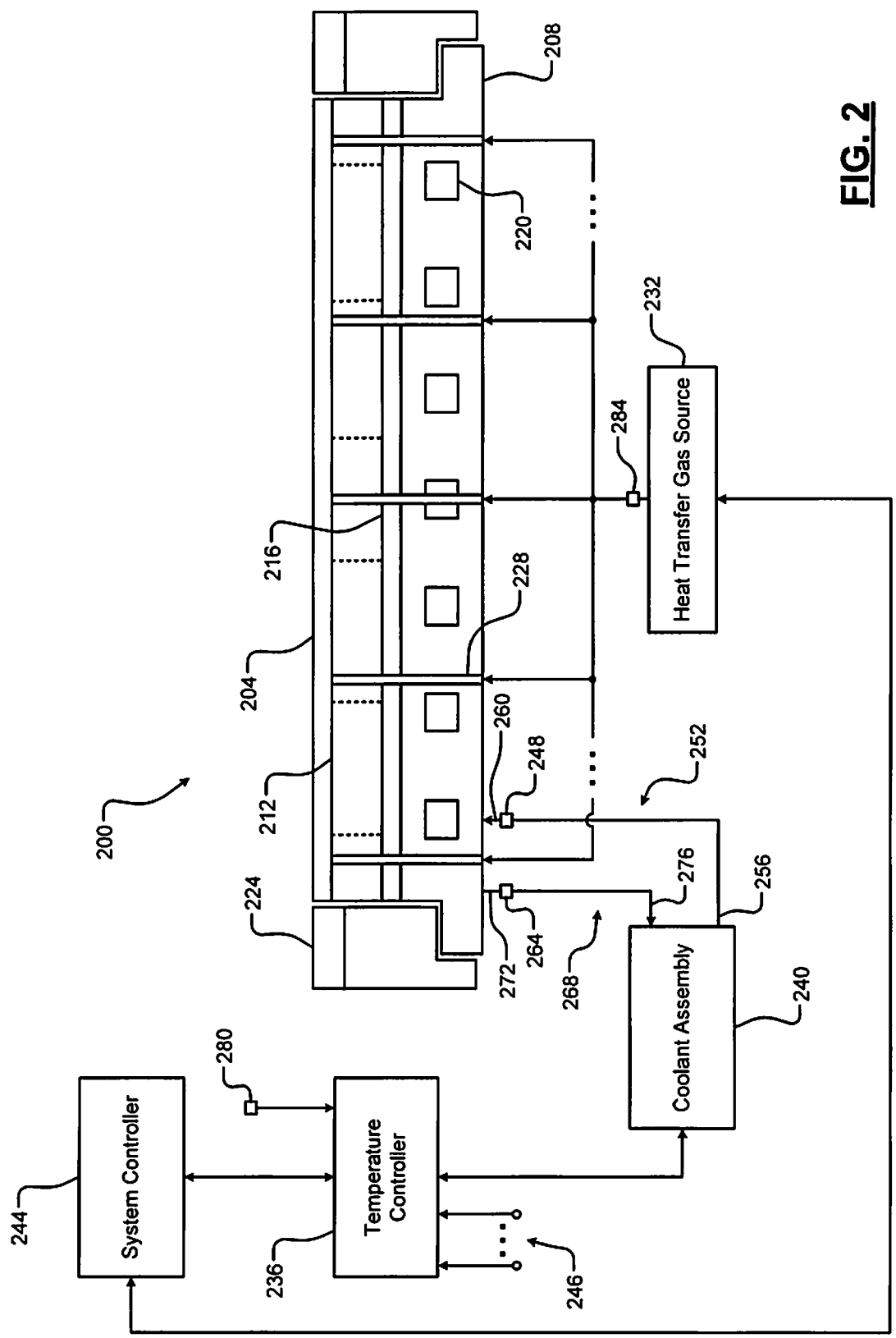
FIG. 2 is an example substrate support according to the present disclosure.

Referring now to FIG. 2, an example substrate support 200 configured to support a substrate 204 is shown. The substrate support 200 includes a conductive baseplate 208, a ceramic layer 212, and, in some examples, a bond layer 216 arranged between the ceramic layer 212 and the baseplate 208. The baseplate 208 may include one or more coolant channels 220 for flowing coolant through the baseplate 208. The substrate support 200 may include an edge ring 224 arranged to surround an outer perimeter of the substrate 204. The substrate support 200 includes a plurality of channels 228 arranged to provide a heat transfer gas such as helium from a heat transfer gas source 232 to a backside (i.e., underside) of the substrate 204. The heat transfer gas facilitates cooling of the substrate 204 and/or the ceramic layer 212.

A temperature controller 236 communicates with a coolant assembly 240 to control coolant flow through the channels 220. The temperature controller 240 operates the coolant assembly 236 to selectively flow the coolant through the channels 220 to cool the substrate support 200. The temperature controller 236 may also communicate with the heat transfer gas source 232 to control flow of the heat transfer gas (e.g., via valves of a gas delivery system such as the gas delivery system 130 described above in FIG. 1). The temperature controller 236 may be a separate controller, implemented within a system controller 244, etc.

The temperature controller 236 is configured to calculate a temperature of the substrate support 200 based on one or more of a plurality of parameters as described below in more detail. For example, the temperature controller 236 is configured to calculate the temperature of the substrate support 200 (e.g., the ceramic layer 212) based on a temperature of the coolant supplied to the substrate support 200 from the coolant assembly 240, a temperature of the coolant returning from (i.e., flowing out of) the substrate support 200 back to the coolant assembly 240, an RF power supplied to the substrate support 200, a flow of the heat transfer gas provided to the substrate support 200 from the heat transfer gas source 232. In some examples, the temperature controller 236 is configured to calculate the temperature of the substrate support further based on a clamping voltage supplied to the substrate support 200.

In one example, the temperature controller 236 receives the parameters from respective sensors (e.g., shown as sensor inputs 246). For example, the temperature controller 236 receives the temperature of the coolant supplied to the substrate support 200 from a sensor 248 arranged in a flow path 252 between an outlet 256 of the coolant assembly 240 and an inlet 260 of the substrate support 200 (e.g., arranged adjacent to the inlet 260). The temperature controller 236 receives the temperature of the coolant returning from the substrate support 200 from a sensor 264 arranged in a flow path 268 between an outlet 272 of the substrate support 200 and an inlet 276 of the coolant assembly 240 (e.g. arranged adjacent to the outlet 272). The temperature controller 236 receives the RF power supplied to the substrate support 200 from the system controller 244, calculates the RF power based on values received from one or more sensors 280, etc. For example, the sensors 280 may provide values indicative of voltage, current or other values used to calculate RF power. The temperature controller 236 may also receive the clamping voltage from the sensors 280, the system controller 244, etc.

The temperature controller 236 receives the flow of the heat transfer gas from one or more sensors (e.g., helium sensors) 284 arranged between the heat transfer gas source 232 and the substrate support 200, determines the flow according to a flow control value received from the system controller 244, etc. For example, the sensors 284 may correspond to sensors measuring heat transfer gas flow to different regions (e.g., zones) of the substrate support 200. In some examples, the substrate support 200 may include a plurality of annular, concentric zones such as an inner (center) zone 286, a mid-inner zone 288, a mid-outer zone 290, and an outer zone 292.

Figure 3:
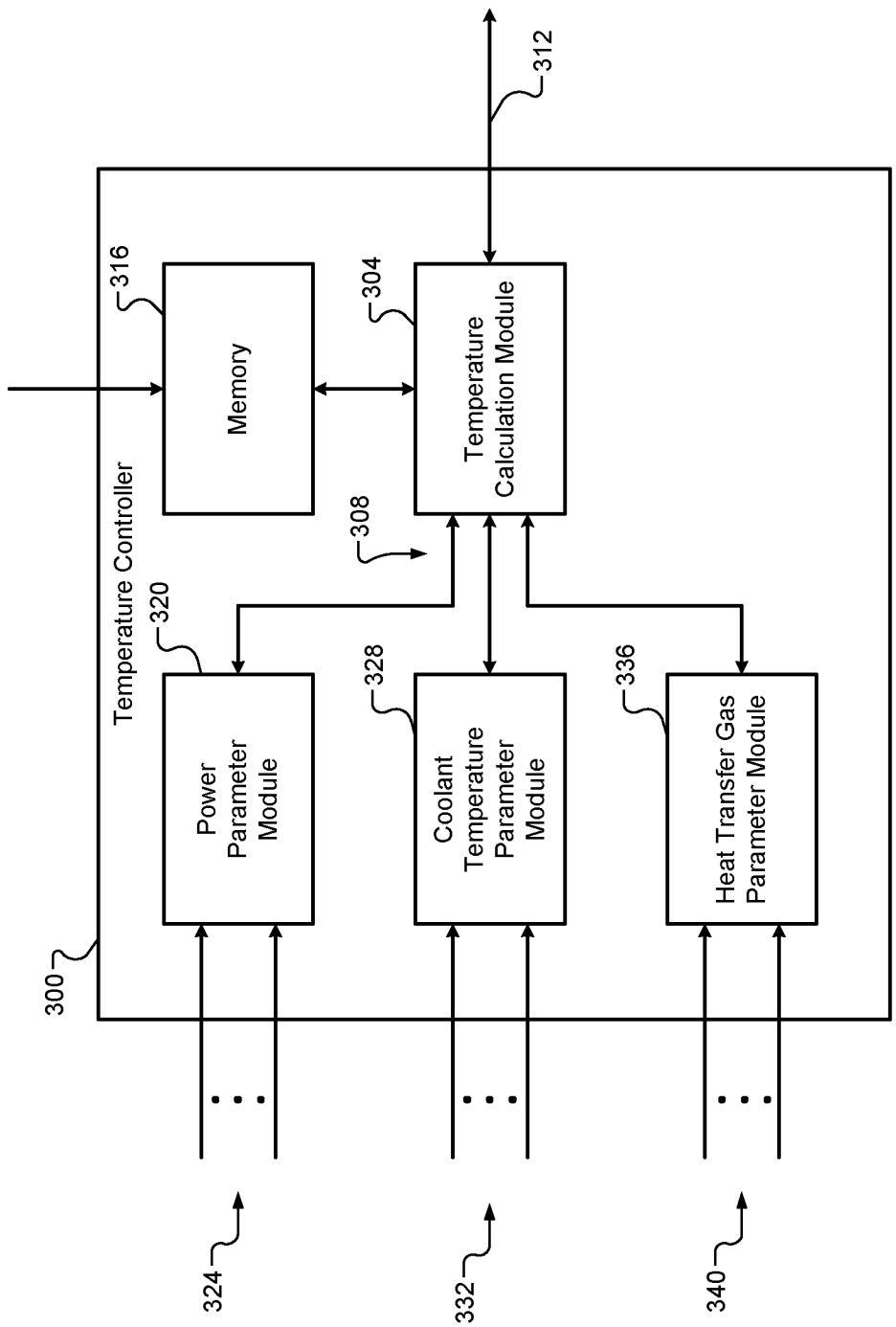
FIG. 3 is an example temperature controller according to the present disclosure.

Referring now to FIG. 3, an example temperature controller 300 is shown. The temperature controller 300 includes a temperature calculation module 304 configured to calculate a temperature of the substrate support 200 (e.g., a temperature of the ceramic layer 212) based on various temperature calculation parameters 308. For example, the temperature calculation module 304 may be configured to execute a model, formula, etc. to calculate the temperature. The temperature calculation module 304 may generate an output signal 312 indicating the calculated temperature. In some examples, the temperature calculation module 304 may further be configured to calculate a temperature of the substrate 204 arranged on the substrate support 200 based on the calculated temperature of the substrate support 200.

The temperature controller 300 may include memory 316 configured to store one or more models, equations, etc. (for simplicity, referred to herein as "equations"). For example, the equations are based on respective correlations between various ones of the temperature calculation parameters 308 and the temperature of the substrate support 200. The equations may vary based on processing chamber, a process being performed, etc. The temperature calculation module 304 retrieves the equation from the memory 316 to calculate the temperature using the corresponding parameters 308.

The temperature controller 300 includes various parameter calculation modules configured to generate the parameters 308. For example, a power parameter module 320 is configured to calculate and output an RF power parameter based on one or more received values 324 indicative of the RF power provided to the substrate support 200. For example, the received values 324 may include a desired RF power (e.g., as commanded by the system controller 244), a measured RF power, a calculated RF power, and/or values used by the module 320 to calculate the RF power (e.g., a duty cycle and sensor values such as voltage, current, etc.).

A coolant temperature parameter module 328 is configured to calculate and output a coolant supply temperature parameter based on one or more received values 332 indicative of coolant supply temperatures. For example, the received values 332 may include a coolant supply temperature and a coolant return temperature corresponding to signals received from the sensors 248 and 264.

A heat transfer gas parameter module 336 is configured to calculate and output a heat transfer gas parameter based on one or more received values 340 indicative of heat transfer gas flow rates. For example, the received values 340 may include respective flow rates of the heat transfer gas supplied to different zones of the substrate support 200.

Although not shown, in other examples the temperature controller 300 may include additional modules configured to provide the temperature calculation parameters 308. For example, others of the temperature calculation parameters may include, but are not limited to, a clamping voltage. In some examples, other values (e.g., measured values, calculated vales, sensed values, etc.) may be provided directly to the temperature calculation module 304.

In one example, the temperature calculation module 304 is configured to calculate the temperature of the ceramic layer 212 according to:

$$T_{support} = A*(P*DC) + B*(dESC) + C*(dHe) \quad \text{(Equation 1)}$$

In Equation 1, $T_{support}$ is the calculated temperature, P corresponds to supplied power, DC corresponds to a duty cycle of an RF power source, dESC corresponds to a difference between the coolant supply temperature and the coolant return temperature, dHe corresponds to a difference between heat transfer gas flow to two different zones of the substrate support 200 (e.g., the inner zone 286 and the outer zone 292), and A, B, and C are constants.

The constants A, B, and C correspond to modification factors that modify respective terms of Equation 1. The modification factors may be determined based on a correlation between sensor measurements and an actual measurement of the temperature of the substrate support 200 (e.g., using temperature sensors during manufacture, calibration, servicing, etc., such as a temperature sensing test wafer). Accordingly, the modification factors may vary for each substrate support, processing chamber, substrate processing tool, a process being performed, process gases being used, etc. In one example, the modification factors are determined according to a model (e.g., a linear regression model) that correlates the measured temperature to various temperature calculation parameters. In other words, the modification factors may be determined prior to operation of the substrate support 200 and stored (e.g., in the memory 316) for use by the temperature calculation module 304. In some examples, the memory 316 may store a plurality of each of the modification factors (e.g., different sets of the modification factors for respective processes or recipes.

The term P*DC may correspond to an average power supplied to the substrate support. In some examples, the RF generating system 120 may correspond to two RF power sources (e.g., a 400 MHz power source and a 60 MHz power source) each configured to provide power pulses at a duty cycle. Accordingly, the average power may correspond to a combined average power calculated according to:

$$P*DC = (P^1_{400} + P^1_{60}) * \left(\frac{DC}{100}\right) + (P^0_{400} + P^0_{60}) * \left(1 - \frac{DC}{100}\right) \quad \text{(Equation 2)}$$

In Equation 2, $P_{400}^1$ is a first power pulse level (e.g., ON, high, etc.) provided by a first power source (e.g., the 400 MHz power source), $P_{60}^1$ is a first power pulse level provided by a second power source (e.g., the 60 MHz power source), $P_{400}^0$ is a second power pulse level (e.g., OFF, low, etc.) provided by the first power source, and $P_{60}^0$ is a second power pulse level provided by the second power source.

In other examples, Equation 1 may be modified. For example, in one example, the temperature calculation module 304 is configured to calculate the temperature according to:

$$T_{support} = A*(P*DC) + B*(dESC) + C*(dHe) - D*(ESC_{clamp}) + (T_{supply} - E) \quad \text{(Equation 3)}$$

In Equation 3, $ESC_{clamp}$ corresponds to the clamping voltage applied to the substrate support 200, $T_{supply}$ corresponds to the coolant supply temperature, and D and E are constants corresponding to modification factors (e.g., analogous to A, B, and C). In other words, in this example, the temperature calculation module 304 calculates the temperature further based on the clamping voltage and the coolant supply temperature.

Figure 4:
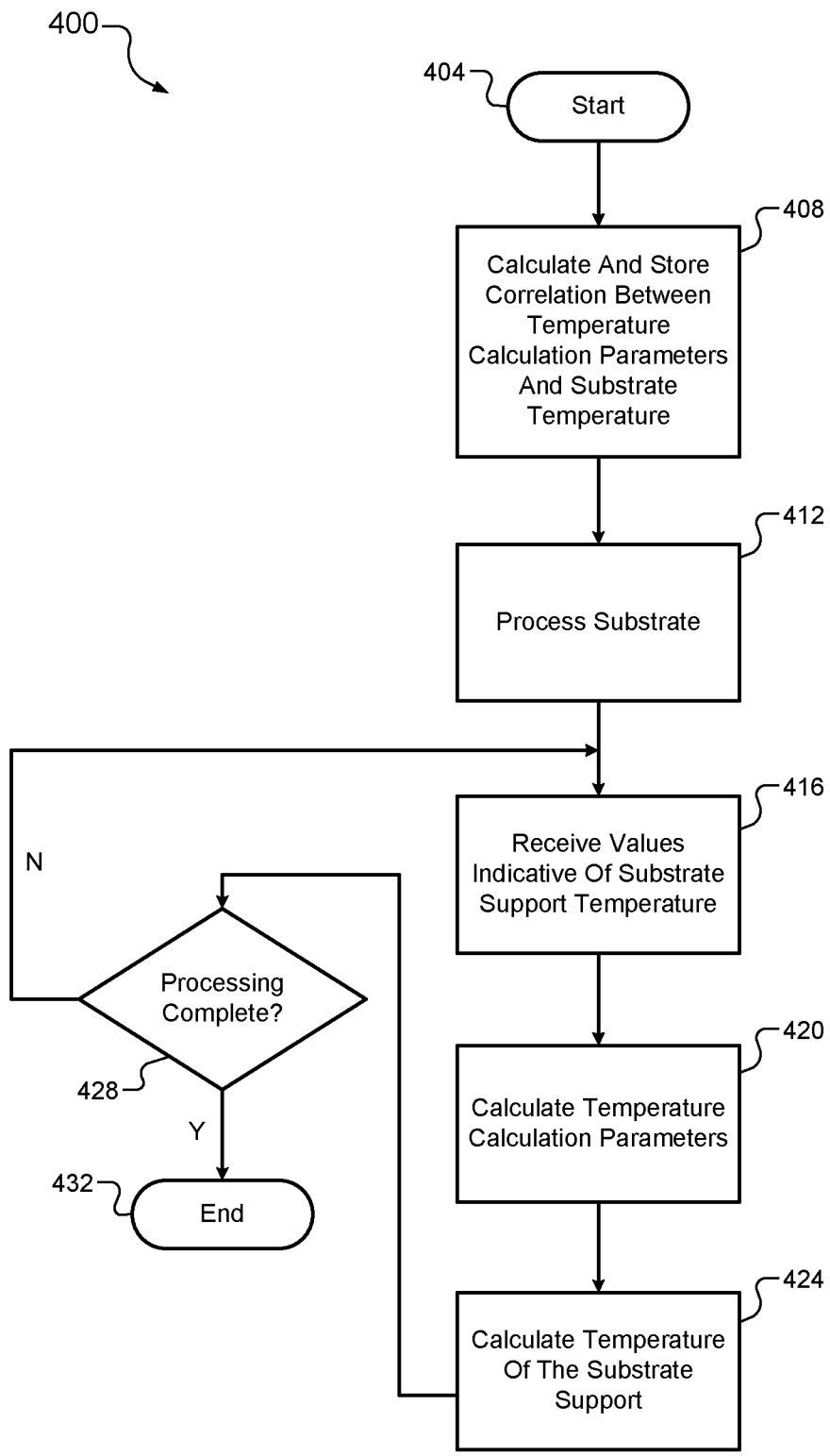
FIG. 4 is an example method for calculating a temperature of a substrate support according to the present disclosure.

Referring now to FIG. 4, an example method 400 for calculating a temperature of a substrate support (e.g., a temperature of the ceramic layer 212 of the substrate support 200) according to the present disclosure begins at 404. At 408, the method 400 determines and stores data indicative of a correlation between one or more temperature calculation parameters and a temperature of the substrate support. For example, the method 400 may determine a correlation between an RF power supplied to the substrate support, respective temperatures of coolant supplied to and returning from the substrate support, flow rates of a heat transfer gas supplied to different zones of the substrate support, and measured temperatures of the substrate support (e.g., using a temperature sensing test wafer and a linear regression model). The method 400 stores the data indicative of the correlation (e.g., one or more equations, models, modification factors, etc.) in memory.

At 412, the method 400 performs processing of a substrate arranged on the substrate support. At 416, the method 400 (e.g., the temperature controller 300) receives a plurality of values indicative of the substrate support temperature. For examples, the values may include sense, measured, and/or calculated values such as power delivered to the substrate support, coolant supply and return temperatures, heat transfer gas flow rates, a clamping voltage, etc. At 420, the method 400 (e.g., the temperature controller 300) calculates the temperature calculation parameters using the received values. At 424, the method 400 (e.g., the temperature controller 300) calculates the temperature of the substrate support using the temperature calculation parameters and the stored data indicative of the correlation between the temperature calculation parameters and the temperature. The calculated temperature may be stored (e.g., in the memory 316) and/or used to adjust one or more parameters associated with control of the processing of the substrate (e.g., control of the heat transfer gas flow, coolant flow, RF power provided, process gas flow, etc.)

At 428, the method 400 determines whether processing of the substrate is complete. If true, the method 400 ends at 432. If false, the method 400 continues to 416.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A temperature controller for a substrate support in a substrate processing system, the temperature controller comprising:
a power parameter module configured to calculate a power supplied to the substrate support;
a coolant temperature parameter module configured to calculate a first temperature of a coolant supplied to the substrate support and second temperature of the coolant returning from the substrate support;
a heat transfer gas parameter module configured to calculate flow rates of a heat transfer gas supplied to the substrate support;
memory that stores data defining a correlation between (i) a temperature of the substrate support and (ii) a combination of the power supplied to the substrate support, the first temperature of the coolant, the second temperature of the coolant, and the flow rates of the heat transfer gas; and
a temperature calculation module configured to
calculate the temperature of the substrate support using the power supplied to the substrate support, the first temperature of the coolant, the second temperature of the coolant, the flow rates of the heat transfer, and the data defining the correlation between the temperature of the substrate support and the combination of the power supplied to the substrate support, the first temperature of the coolant, the second temperature of the coolant, and the flow rates of the heat transfer gas.

2. The temperature controller of claim 1, wherein the calculated power corresponds to an average power supplied to the substrate support by a plurality of power sources.

3. The temperature controller of claim 2, wherein the power parameter module is configured to calculate the average power based on a first power supplied by a first power source, a second power supplied by a second power source, and a duty cycle.

4. The temperature controller of claim 1, wherein the flow rates include a first flow rate of the heat transfer gas supplied to a first zone of the substrate support and a second flow rate of the heat transfer gas supplied to a second zone of the substrate support.

5. The temperature controller of claim 1, wherein the temperature calculation module is configured to calculate the temperature of the substrate support further based on a clamping voltage applied to the substrate support.

6. The temperature controller of claim 1, wherein the temperature calculation module is configured to calculate the temperature of the substrate support according to a sum of (i) a first product of a first modification factor and the power, (ii) a second product of a second modification factor and a difference between the first temperature of the coolant and the second temperature of the coolant, and (iii) a third product of a third modification factor and a difference between first and second flow rates of the flow rates of the heat transfer gas.

7. The temperature controller of claim 1, wherein the calculated temperature of the substrate support corresponds to a temperature of a ceramic layer.

8. The temperature controller of claim 1, wherein the temperature controller is configured to control, based on the calculated temperature of the substrate support, at least one of a flow of the coolant and the flow rates of the heat transfer gas.

9. A method of controlling a temperature of a substrate support in a substrate processing system, the method comprising:
calculating a power supplied to the substrate support;
calculating a first temperature of a coolant supplied to the substrate support and a second temperature of the coolant returning from the substrate support;
calculating flow rates of a heat transfer gas supplied to the substrate support;
calculating and storing data defining a correlation between (i) a temperature of the substrate support and (ii) a combination of the power supplied to the substrate support, the first temperature of the coolant, the second temperature of the coolant, and the flow rates of the heat transfer gas;
calculating the temperature of the substrate support using the power supplied to the substrate support, the first temperature of the coolant, the second temperature of the coolant, the flow rates of the heat transfer gas, and the data defining the correlation between the temperature of the substrate support and the combination of the power supplied to the substrate support, the first temperature of the coolant, the second temperature of the coolant, and the flow rates of the heat transfer gas; and
controlling, based on the calculated temperature of the substrate support, at least one of a flow of the coolant and the flow rates of the heat transfer gas.

10. The method of claim 9, wherein the calculated power corresponds to an average power supplied to the substrate support by a plurality of power sources.

11. The method of claim 10, wherein calculating the average power includes calculating the average power based on a first power supplied by a first power source, a second power supplied by a second power source, and a duty cycle.

12. The method of claim 9, wherein the flow rates include a first flow rate of the heat transfer gas supplied to a first zone of the substrate support and a second flow rate of the heat transfer gas supplied to a second zone of the substrate support.

13. The method of claim 9, wherein calculating the temperature of the substrate support includes calculating the temperature of the substrate support further based on a clamping voltage applied to the substrate support.

14. The method of claim 9, wherein calculating the temperature of the substrate support includes calculating the temperature of the substrate support according to a sum of (i) a first product of a first modification factor and the power, (ii) a second product of a second modification factor and a difference between the first temperature of the coolant and the second temperature of the coolant, and (iii) a third product of a third modification factor and a difference between first and second flow rates of the flow rates of the heat transfer gas.

* * * * *